(12) United States Patent
Heijmans et al.

(10) Patent No.: US 11,262,663 B2
(45) Date of Patent: Mar. 1, 2022

(54) TUBULAR LINEAR ACTUATOR, PATTERNING DEVICE MASKING DEVICE AND LITHOGRAPHIC APPARATUS

(71) Applicant: ASML Netherlands B.V., Veldhoven (NL)

(72) Inventors: Peter Michel Silvester Maria Heijmans, Weert (NL); Olof Martinus Josephus Fischer, Veldhoven (NL); Maarten Hartger Kimman, Veldhoven (NL); Edwin Van Horne, Waalre (NL); Antonie Hendrik Verweij, Dussen (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/050,240

(22) PCT Filed: Mar. 21, 2019

(86) PCT No.: PCT/EP2019/057041
§ 371 (c)(1),
(2) Date: Oct. 23, 2020

(87) PCT Pub. No.: WO2019/206531
PCT Pub. Date: Oct. 31, 2019

(65) Prior Publication Data
US 2021/0080840 A1    Mar. 18, 2021

(30) Foreign Application Priority Data
Apr. 25, 2018  (EP) .................................... 18169161

(51) Int. Cl.
*G03F 7/20*       (2006.01)
*H02K 41/03*   (2006.01)

(52) U.S. Cl.
CPC ...... *G03F 7/70758* (2013.01); *G03F 7/70066* (2013.01); *H02K 41/031* (2013.01); *G03F 7/70725* (2013.01); *H02K 2207/03* (2013.01)

(58) Field of Classification Search
CPC ............. G03F 7/70758; G03F 7/70066; G03F 7/70725; G03F 7/70691; G03F 7/70716;
(Continued)

(56) References Cited

U.S. PATENT DOCUMENTS

| | | | |
|---|---|---|---|
| 5,298,819 A | * | 3/1994 | Suganuma ........... H02K 41/025 310/12.22 |
| 6,020,964 A | | 2/2000 | Loopstra et al. |

(Continued)

FOREIGN PATENT DOCUMENTS

| | | |
|---|---|---|
| JP | 2001-008430 A | 1/2001 |
| JP | 2010-158140 A | 7/2010 |
| TW | 2013-12905 A1 | 3/2013 |

OTHER PUBLICATIONS

English translation of TW2013-12905, published Mar. 16, 2013. (Year: 2013).*

(Continued)

*Primary Examiner* — Christina A Riddle
(74) *Attorney, Agent, or Firm* — Sterne, Kessler, Goldstein & Fox P.L.L.

(57) ABSTRACT

The present invention provides a tubular linear actuator, comprising: a tubular coil assembly comprising multiple tubular coils arranged next to each other in longitudinal direction of the tubular linear actuator and concentric with respect to a longitudinal axis of the tubular linear actuator, and a magnet assembly comprising a series of permanent magnets with alternating polarization direction extending in the longitudinal direction, wherein the magnet assembly is at least partially arranged in the coil assembly and movably (Continued)

with respect to the coil assembly, wherein the tubular coils comprise edge windings.

12 Claims, 7 Drawing Sheets

(58) Field of Classification Search
CPC ............ G03F 7/70733; G03F 7/70766; G03F 7/70775; G03F 7/70783; G03F 7/70791; G03F 7/708; G03F 7/70816; G03F 7/70825; G03F 7/70833; G03F 7/709; G03F 7/70141; H02K 41/031; H02K 2207/03; H02K 1/278
USPC ............................ 355/52–55, 67–71, 72–77; 310/12.01–12.33
See application file for complete search history.

(56) References Cited

U.S. PATENT DOCUMENTS

| | | |
|---|---|---|
| 6,313,551 B1 | 11/2001 | Hazelton |
| 6,952,253 B2 | 10/2005 | Lof et al. |
| 2004/0207271 A1 | 10/2004 | Korenaga et al. |
| 2005/0200830 A1 | 9/2005 | Carter et al. |
| 2006/0139615 A1 | 6/2006 | Mee et al. |
| 2006/0181158 A1* | 8/2006 | Tajima ............ H02K 41/03 310/12.04 |
| 2007/0058173 A1 | 3/2007 | Holzapfel |
| 2008/0220930 A1 | 9/2008 | Ramsay et al. |
| 2010/0052437 A1 | 3/2010 | Froeschle et al. |
| 2013/0026279 A1* | 1/2013 | Agrikli ............ H02K 41/0356 242/476.7 |
| 2014/0312716 A1 | 10/2014 | Hunter et al. |
| 2015/0035397 A1* | 2/2015 | Okinaga ............ H02K 3/345 310/71 |

OTHER PUBLICATIONS

International Search Report and Written Opinion of the International Searching Authority directed to related International Patent Application No. PCT/EP2019/057041, dated Jul. 4, 2019; 11 pages.
International Preliminary Report on Patentability directed to related International Patent Application No. PCT/EP2019/057041, dated Oct. 27, 2020; 9 pages.

* cited by examiner

TUBULAR LINEAR ACTUATOR, PATTERNING DEVICE MASKING DEVICE AND LITHOGRAPHIC APPARATUS

CROSS-REFERENCE TO RELATED APPLICATIONS

This application claims priority of EP application 18169161.9 which was filed on Apr. 25, 2018 and which is incorporated herein in its entirety by reference.

FIELD OF THE INVENTION

The present invention relates to a tubular linear actuator, a patterning device masking device and a lithographic apparatus.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a known scanner type lithographic apparatus, a patterning device masking device is used to block any light which would be projected outside the actual pattern to be projected. Such patterning device masking device may have the following benefits. The patterning device masking device (1) removes the need for having a wide (i.e., expensive) light blocking border area, for instance of chrome, (2) blocks light that might otherwise leak through pin holes in the border area, (3) allows a selected portion of the full patterned area to be exposed, and (4) selectively blocks patterning device alignment targets so that they are not printed on the substrate.

Generally, the patterning device masking device of the known lithographic apparatus includes four independently movable masking blades configured as two pairs. One pair of masking blades has edges that are aligned parallel to the exposure scan axis. This first pair remains normally stationary during the exposure scan and delimits the width of the exposed field. A second pair of masking blades has edges that are aligned orthogonal to the scan axis. This second pair moves synchronously with the patterning and delimits the dimension of the radiation beam which is to be projected on a patterning device and thus of the length of the exposed field.

An example of a known patterning device masking device is for instance disclosed in US 2005/0200830A1, the contents of which are herein incorporated by reference.

With increasing demand on throughput and overlay performance of a lithographic apparatus, there is a need to improve the performance of the patterning device masking device. In particular, the movement of the masking blades should be sufficiently fast and accurate. Thereby, there may also be the need to provide an actuator system for the masking blades that requires a smaller volume, more efficiency and as a result less power dissipation.

SUMMARY OF THE INVENTION

It is an object of the invention to provide an actuator for a movable element, in particular a masking blade of a patterning device masking device, that is capable of delivering high performance with respect to acceleration and velocity and/or heat dissipation. It is a general object of the invention to provide an improved actuator for a movable element, in particular a movable element for a lithographic apparatus.

According to an aspect of the invention, there is provided a tubular linear actuator, comprising:

a tubular coil assembly comprising multiple tubular coils arranged next to each other in longitudinal direction of the tubular linear actuator and concentric with respect to a longitudinal axis of the tubular linear actuator, and a magnet assembly comprising a series of permanent magnets with alternating polarization direction and extending in the longitudinal direction, wherein the magnet assembly is at least partially arranged in the coil assembly and movably with respect to the coil assembly, and wherein the tubular coils comprise edge windings.

According to an aspect of the invention, there is provided a tubular linear actuator, comprising:

a tubular coil assembly comprising multiple tubular coils arranged next to each other in longitudinal direction of the tubular linear actuator and concentric with respect to a longitudinal axis of the tubular linear actuator, and a tubular magnet assembly comprising a series of permanent magnets with alternating polarization direction extending in the longitudinal direction, wherein the magnet assembly is at least partially arranged in the coil assembly and is movable with respect to the coil assembly in an actuation direction parallel to the longitudinal axis, wherein the tubular linear actuator is a one-phase tubular actuator.

According to an aspect of the invention, there is provided a patterning device masking device arranged to delimit a beam dimension of a radiation beam of a lithographic apparatus, comprising one or more movable masking blades and at least one tubular linear actuator to move the one or more movable masking blades, wherein the at least one tubular linear actuator comprises:

a tubular coil assembly comprising multiple tubular coils arranged next to each other in longitudinal direction of the tubular linear actuator and concentric with respect to a longitudinal axis of the tubular linear actuator, and a magnet assembly comprising a series of permanent magnets with alternating polarization direction and extending in the longitudinal direction, wherein the magnet assembly is at least partially arranged in the coil assembly and movably with respect to the coil assembly, and wherein the tubular coils comprise edge windings.

According to an aspect of the invention, there is provided a lithographic apparatus comprising:

a movable object, and an actuator to move the movable object, wherein the actuator is a tubular linear actuator, comprising:

a tubular coil assembly comprising multiple tubular coils arranged next to each other in longitudinal direction of the tubular linear actuator and concentric with respect to a longitudinal axis of the tubular linear actuator, and a magnet assembly comprising a series of permanent magnets with alternating polarization direction and extending in the longitudinal direction, wherein the magnet assembly is at least partially arranged in the coil assembly and movably with respect to the coil assembly, and wherein the tubular coils comprise edge windings.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
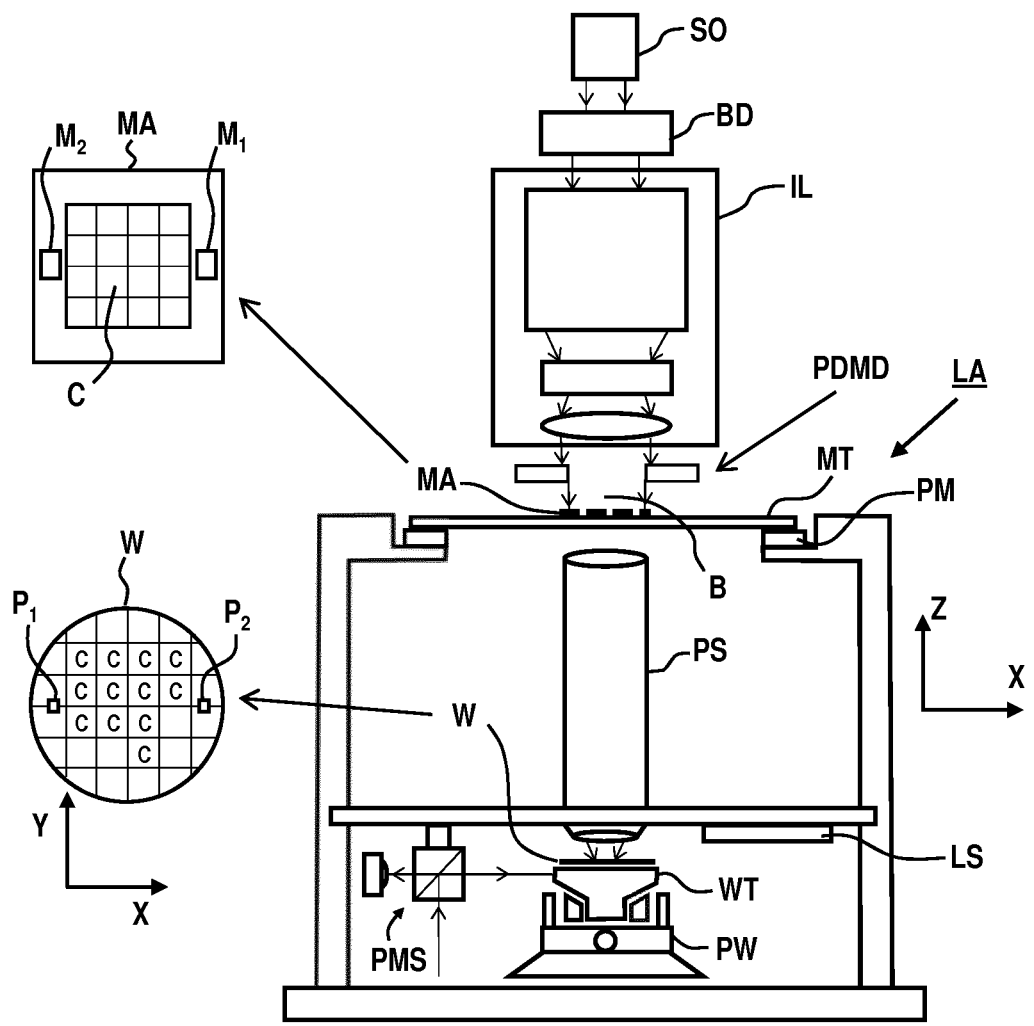
FIG. 1 depicts a lithographic apparatus according to an embodiment of the invention.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
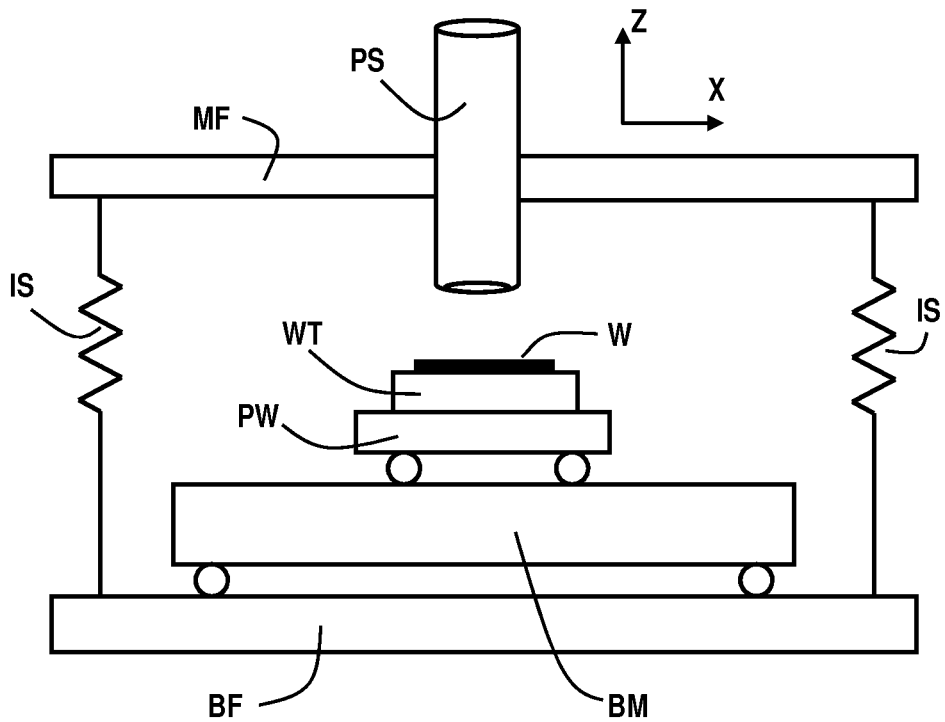
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a planar motor to levitate the substrate support WT above the balance mass BM. In another embodiment, the second positioner PW is supported by the base frame BF. For example, wherein the second positioner PW comprises a linear motor and wherein the second positioner PW comprises a bearing, like a gas bearing, to levitate the substrate support WT above the base frame BF.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor, a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference. The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads are arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the metrology frame MF. In an embodiment, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement.

The first positioner PM and the second positioner PW each are provided with an actuator to move respectively the mask support MT and the substrate support WT. The actuator may be a linear actuator to provide a driving force along a single axis, for example the y-axis. Multiple linear actuators may be applied to provide driving forces along multiple axis. The actuator may be a planar actuator to provide a driving force along multiple axis. For example, the planar actuator may be arranged to move the substrate support WT in 6 degrees of freedom. The actuator may be an electromagnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the substrate support WT respectively to the mask support MT. The actuator may be a moving-coil type actuator which has the at least one coil coupled to the substrate support WT respectively to the mask support MT. The actuator may be a voice-coil actuator, a reluctance actuator, a Lorentz-actuator or a piezo-actuator, or any other suitable actuator.

Figure 3:
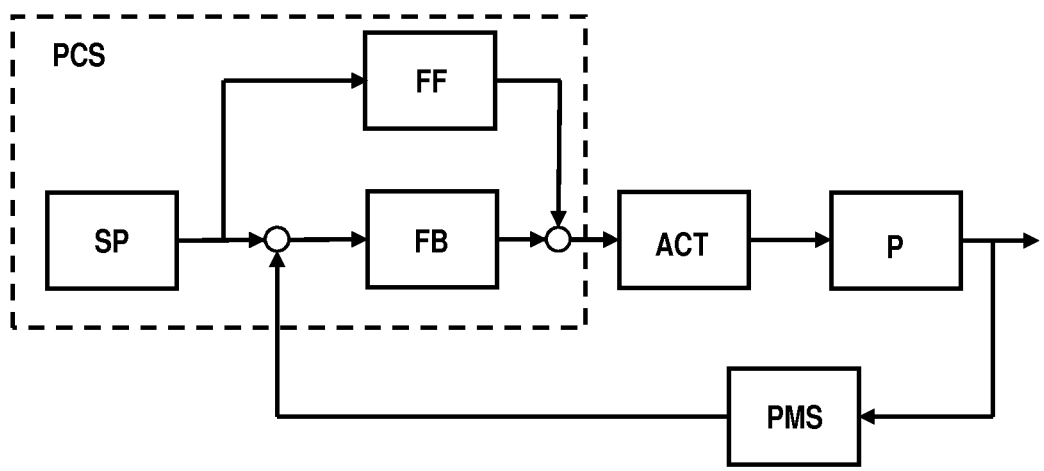
FIG. 3 schematically depicts a position control system.

The lithographic apparatus LA comprises a position control system PCS as schematically depicted in FIG. 3. The position control system PCS comprises a setpoint generator SP, a feedforward controller FF and a feedback controller FB. The position control system PCS provides a drive signal to the actuator ACT. The actuator ACT may be the actuator of the first positioner PM or the second positioner PW. The actuator ACT drives the plant P, which may comprise the substrate support WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator ACT. The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, resonance modes and eigenfrequencies.

In the lithographic apparatus as shown in FIG. 1, a patterning device masking device PDMD is provided. The patterning device masking device PDMD is used to block any light which would be projected outside the actual pattern to be projected.

An example of a known patterning device masking device PDMD is for instance disclosed in US 2005/0200830A1, the contents of which are herein incorporated by reference.

Figure 4:
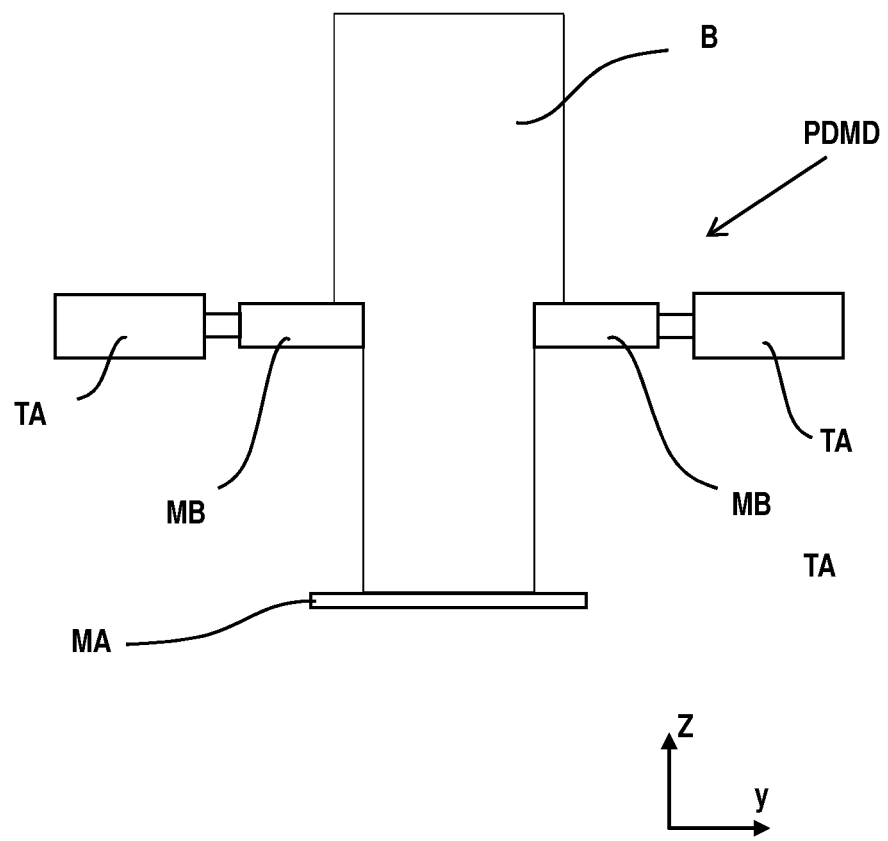
FIG. 4 depicts a patterning device masking device according to an embodiment of the invention.

FIG. 4 shows a patterning device masking device PDMD according to an embodiment of the invention. The patterning device masking device PDMD comprises four independently movable masking blades configured as two pairs. A first pair of masking blades has edges that are aligned parallel to the exposure scan axis. The exposure scan axis in Figure is the y-axis. The first pair of masking blades (not shown in FIG. 4) that is movable in x-direction remains normally stationary during the exposure scan and delimits the width of the exposed field. A second pair of masking blades MB has edges that are aligned parallel to the x-axis. This second pair of masking blades MB moves synchronously with the exposure scan in y-direction and delimits the dimension of the radiation beam B which is to be projected on a patterning device MA and thus of the length of the exposed field.

Each of the masking blades MB of the second pair of masking blades MB is connected to a tubular linear actuator TA. The tubular linear actuator TA is arranged to move the masking blades MB to a desired position in the y-direction. The patterning device masking device PDMD may comprise four tubular linear actuators TA, wherein each tubular linear actuator TA is connected with one of the masking blades MB to independently move the respective masking blade to a desired position. However, since the first pair of masking blades that are movable in x-direction are normally stationary during the actual exposure scan, also actuators with less high performance may be used to position the first pair of masking blades.

Figure 5:
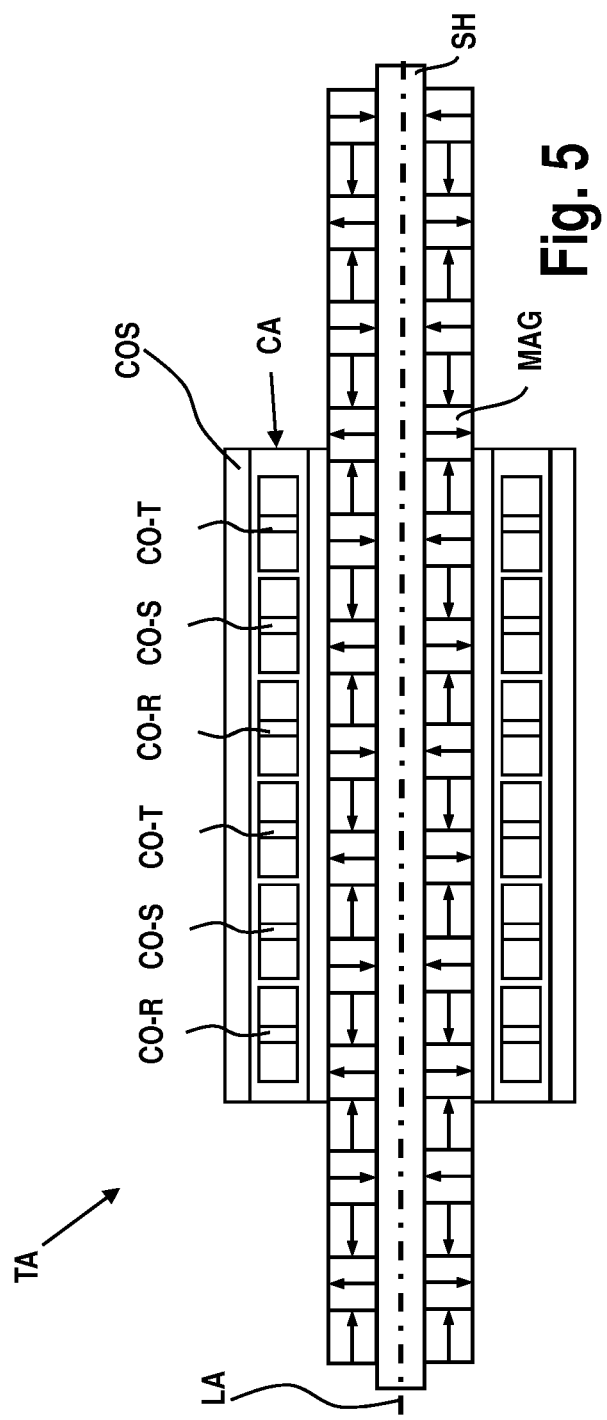
FIG. 5 depicts a tubular linear actuator according to a first embodiment of the invention.

FIG. 5 shows the tubular linear actuator TA in more detail. The tubular linear actuator TA comprises a tubular coil assembly CA comprising multiple tubular coils CO-R, CO-S, CO-T arranged next to each other in longitudinal direction of the tubular linear actuator TA, i.e. in the direction of a longitudinal axis LA of the tubular linear actuator TA. The tubular coils CO-R, CO-S, CO-T are further arranged concentrically with respect to the longitudinal axis LA of the tubular linear actuator TA, i.e. the longitudinal axis of each of the coils CO-R, CO-S, CO-T is arranged on the same line as the longitudinal axis of the tubular linear actuator TA.

The tubular linear actuator TA further comprises a magnet assembly MAG comprising a series of permanent magnets with alternating polarization direction. The series of permanent magnets extends in the longitudinal direction of the tubular linear actuator TA and is arranged on the longitudinal axis LA. The magnet assembly MAG extends partially in the coil assembly CA and is arranged movably with respect to the coil assembly CA. The polarization directions of the permanent magnets of the magnet assembly MAG alternately extend in axial direction, i.e. parallel to the longitudinal axis, and radial direction, i.e. perpendicular to the longitudinal axis LA of the tubular linear actuator TA. Such arrangement of polarization directions is also known as a Halbach arrangement of permanent magnets.

The permanent magnets of the magnet assembly MAG are ring shaped and arranged om a shaft SH concentrically with respect to the longitudinal axis LA of the tubular linear actuator TA. The shaft SH may be hollow shaft in order to reduce the weight of the shaft SH. The hollow shaft may also be part of a gas bearing for the magnet assembly MAG and a movable part connected to the magnet assembly MAG.

The ring shaped magnets may be formed by rings of a single material, or assembled from ring segments. Any other suitable shape of the permanent magnets may also be used.

The magnets may comprise any suitable magnet material, for example SmCo or NdFeB.

The magnet assembly MAG is connected to the associated masking blade MB, while the coil assembly CA is provided as a stationary part of the tubular linear actuator TA. The coil assembly CA is for example mounted on the metrology frame of the lithographic apparatus, or any suitable part.

The coil assembly CA may be a multiphase coil assembly, e.g. a three phase coil assembly having two first phase coils CO-R, two second phase coils CO-S and two third phase coils CO-T. In an embodiment, the multiphase coil assembly may be powered by a multiphase power supply, e.g. a three-phase power supply. Alternatively, the coils CO-R, CO-S and CO-T may be supplied by three single phase power supplies. During operation, a controller may be configured to control the power supply which powers the first phase coils CO-R, the second phase coils CO-S and the third phase coils CO-T, thereby actuating the tubular linear actuator TA to position a masking blade MB connected to the magnet assembly MAG into a desired position.

The advantage of the tubular linear actuator TA as shown in FIG. 5 is that the total coil volume of the tubular linear actuator TA contributes to force generation. This is not the case for a flatbed linear actuator having a three phase coil assembly. A flatbed linear actuator comprises coils having straight parts and curved return parts. Mainly the straight parts of each coil contribute to the force generation. In the curved parts, only the part of the current vector in the same direction as the straight parts contributes to force generation. By decreasing the length of the coil, the ratio between length of straight parts and length of return parts in the coil actuation direction also decreases. Thus, in particular when the available volume is limited, the return parts of the coil may form a substantial part of the length and volume of the coil. This leads to an less efficient use of the volume of conductive material, for example copper, in the coil.

This less efficient use of the volume of conductive material in the coil is not present in the tubular coil assembly CA having tubular coils as the whole coil volume of such tubular coil assembly CA contributes to force generation. As a result, the tubular linear actuator TA is in particular suitable for actuators that have to be arranged in a relatively small volume.

Figure 6:
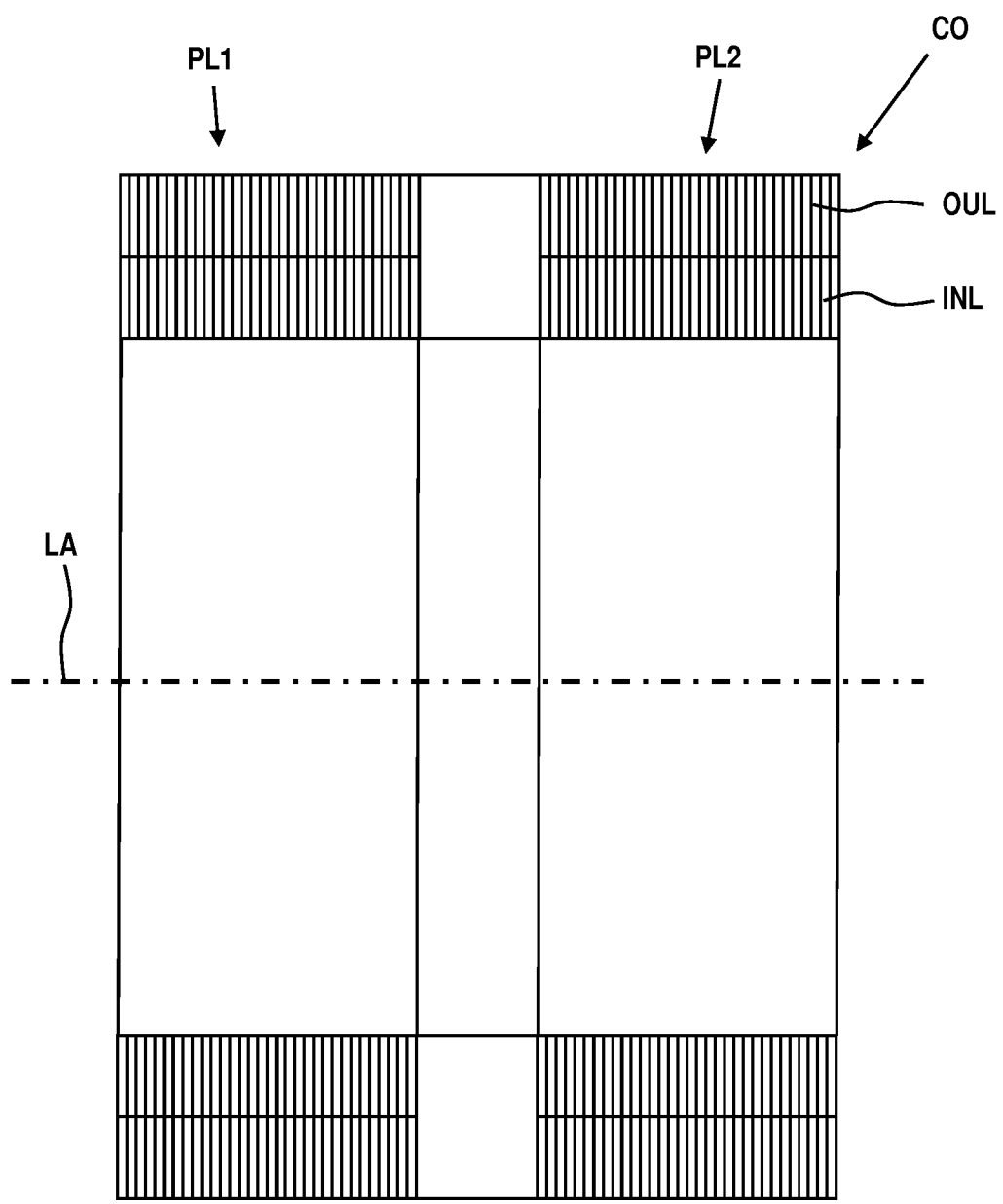
FIG. 6 depicts a coil of the tubular linear actuator of FIG. 5 in more detail.

FIG. 6 shows a coil CO in more detail. Each of the tubular coils CO-R, CO-S, CO-T may be constructed as shown in FIG. 6. The coil CO comprises a first phase leg PL1 having a first winding in a first winding direction and a second phase leg PL2 comprising a second winding in a second winding direction. During use, a first current direction in the first winding should be opposite to a second current direction in the second winding. The first winding and the second winding are therefore serially connected, whereby the lead out of the first winding is connected to the lead in of the second winding, and the first winding direction is opposite to the second winding direction. For example, the first winding is clockwise with respect to the longitudinal axis LA and the second winding is counter-clockwise with respect to the longitudinal axis LA.

By opposite first and second winding directions and connecting the lead out of the first winding to the lead in of the second winding, the first current direction in the first winding and the second current direction the second winding are opposite to each other. In an alternative embodiment, the first winding direction of the first winding and the second winding direction of the second winding may be the same, while the lead out of the first winding is connected to the lead out of the second winding. This also results in a first current direction in the first winding opposite to a second current direction in the second winding.

The first winding and second winding are spaced from each other in axial direction.

The first winding and the second winding are edge windings, also referred to as edge-wise windings, having a rectangular cross section, wherein side surfaces of the edge windings are arranged abutting against each other. As a result of the shape of the cross section of the edge windings, there is little space between two adjacent cross sections of the respective windings. Edge windings will typically have a cross section with a large height, i.e. dimension in radial direction of the coil CO, compared with the width, i.e. dimension in axial direction of the coil CO. The ratio height vs. width of the cross section of the edge windings is preferably at least 5:1, more preferably at least 10:1, for example 15:1. Such ratio height vs. width will have a positive on the heat dissipation in radial direction of the coil CO.

The advantage of the edge windings is that the heat dissipated in the coil assembly CA can be better conducted, in particular in radial direction of the coil assembly, to the environment, for example by a cooling system COS, compared with tubular actuators having windings of wire with round cross section. In an embodiment with wire with a round cross section, the coil insulation and adhesives between the coil wires will limit the heat conduction to the environment, e.g. a cooling system.

Introduction of edge windings in the tubular linear actuator TA may improve for example the thermal conductivity from 1.6 W/m/K, when using round copper wire, to 400 W/m/K, when using copper edge winding. In the coil CO, the number of insulation and adhesive barriers for each round coil copper wire is reduced to one barrier at the inner and outer diameter of the coil CO. This thermal conductivity improvement may result in 85% gain in thermal conductivity of the coil CO in the radial direction. Such gain in thermal conductivity in the coil CO has a substantial positive effect on the performance of the tubular linear actuator TA.

In the shown embodiment, the first winding and the second winding each comprise an inner layer INL and an outer layer OUL. The inner layer INL and the outer layer OUL are concentric with respect to the longitudinal axis LA. The inner layer INL and the outer layer OUL are provided to obtain a beneficial ratio height vs. width of the rectangular cross section of the first and second winding. The ratio height vs. width is preferably 25:1 or smaller, more preferably 20:1 or smaller. In alternative embodiments of the coil CO, one layer or three or more layers of wire having a rectangular cross section may also be applied.

The first winding and the second winding are made of copper, but may also be made of any other suitable conductive material.

The coil CO as shown in FIG. 6 is very suitable to be arranged in a small volume. The conductive material is maximally used for force generation due to the tubular shape of the coil CO, and the heat dissipated in the coil CO can relatively easily be conducted to the environment, for example to a cooling system COS arranged around the coil assembly CA.

Figure 7:
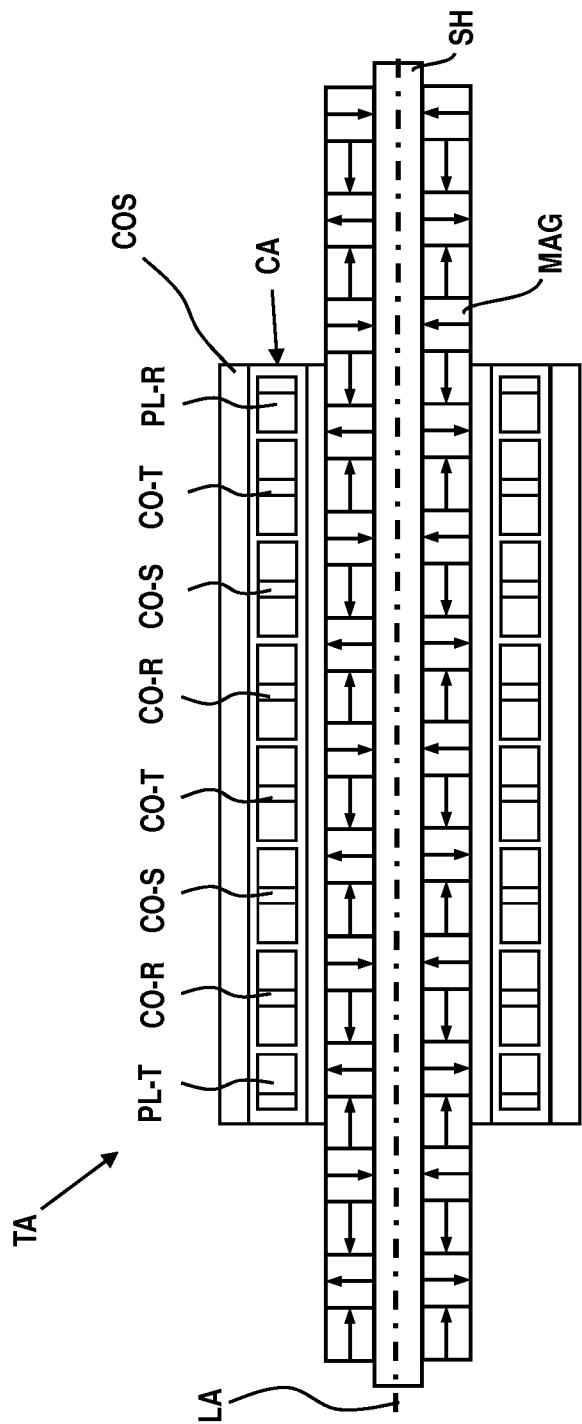
FIG. 7 depicts a tubular linear actuator according to a second embodiment of the invention.

FIG. 7 shows an alternative embodiment of the tubular linear actuator TA. The construction of the tubular linear actuator TA is similar to the embodiment of FIG. 5. The coil assembly CA is a three phase coil assembly having two first coils CO-R connected to the first phase, two second coils CO-S connected to the second phase and two third coils CO-T connected to the third phase. The tubular coils CO-R, CO-S, CO-T are constructed as shown in FIG. 6. Each of the tubular coils CO-R, CO-S, CO-T have a first phase leg PL1 with a first winding in the first winding direction and a second phase leg PL2 with a second winding in the second winding direction. The first winding and the second winding are edge windings, i.e. windings having a wire with rectangular cross-section.

The coil assembly CA further comprises at one axial end a first additional phase leg PL-T comprising a winding in the second winding direction and at the second axial end a second additional phase leg PL-R comprising a winding in the first winding direction. The winding of the first additional phase leg PL-T is serially connected to the closest third coil CO-T and the winding of the second additional phase leg PL-R is serially connected to the closest first coil CO-R.

The winding of the first additional phase leg PL-T and the winding of the second additional phase leg PL-R are edge windings corresponding to the shape of the windings of the tubular coils CO-R, CO-S, CO-T, as shown in FIG. 6, but only comprising one phase leg PL-T, PL-R instead of two phase legs PL1, PL2. It is remarked that, as an alternative, it is also possible to provide an additional phase leg having a different shape and/or dimension. For example, the additional phase leg may be smaller in the longitudinal direction, i.e. parallel to the longitudinal axis LA of the tubular linear actuator TA.

The tubular linear actuator TA further comprises a magnet assembly MAG comprising a series of permanent magnets with alternating polarization direction. The magnet assembly MAG may be constructed the same as the magnet assembly MAG as the embodiment of FIG. 5.

The advantage of the additional phase legs PL-T, PL-R is that the stroke of the magnet assembly MAG and therewith the movable masking blade MB may be increased without the need of adding a complete coil having a first phase leg PL1 and a second phase leg PL2. It is remarked that in other embodiments, a complete coil CO may be added in the coil assembly CA to increase the stroke of the magnet assembly MAG with respect to the coil assembly CA.

Another advantage of the additional phase legs PL-T, PL-R and/or additional coils CO is that these additional phase legs PL-T, PL-R and/or additional coils CO can be used to adapt edge effects. The additional phase legs PL-T, PL-R and/or additional coils CO may be used to create a positive effect on the linearity of the motor constant, in particular at the end of the stroke of the magnet assembly MAG. In alternative embodiments, the edge effects may also be increased by the provision of the additional phase legs PL-T, PL-R and/or additional coils CO in case such increase is desirable.

Figure 8:
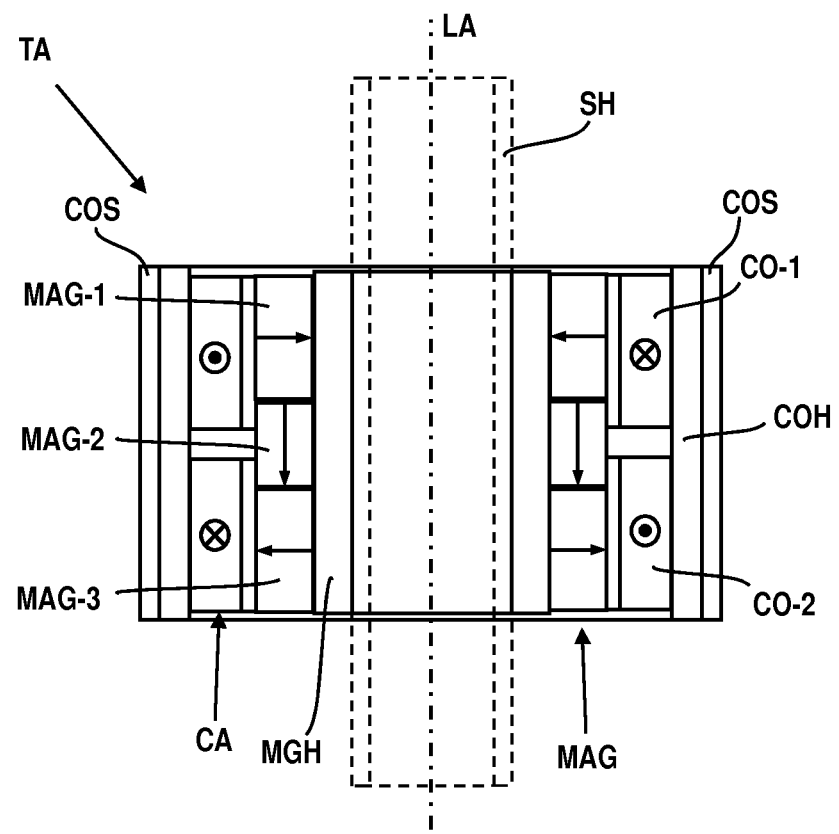
FIG. 8 depicts a one-phase tubular linear actuator according to a further embodiment of the invention.

FIG. 8 depicts a further embodiment of a tubular linear actuator TA. The tubular linear actuator TA of FIG. 8 is a one-phase tubular actuator based on a voice coil motor principle, and has a substantially rotationally symmetric construction with respect to a longitudinal axis LA of the tubular linear actuator TA. The longitudinal axis extends in the longitudinal direction of the tubular linear actuator TA.

The tubular linear actuator TA comprises a tubular coil assembly CA concentric with respect to the longitudinal axis LA of the tubular linear actuator TA. The coil assembly CA comprises a first tubular coil CO-1 and a second tubular coil CO-2. The tubular linear actuator TA is arranged to provide a current flow in the first tubular coil CO-1 in a first current direction and a current flow in the second tubular coil CO-2 in a second current direction, as indicated in FIG. 8, wherein the first current direction and the second current direction are opposite to each other, as indicated in FIG. 8.

The opposite first and second current direction of the first coil CO-1 and the second coil CO-2, respectively, are obtained by using opposite winding directions for the first coil CO-1 and the second coil CO-2, whereby the first coil CO-1 and the second coil CO-2 are serially connected to a current source that provides the current to the first coil CO-1 and the second coil CO-2. Any other suitable way of creating opposite current directions the first coil CO-1 and second coil CO-2 may also be applied.

The first coil CO-1 and the second coil CO-2 are mounted on a coil holder COH that in its turn may be mounted on a reference such as a base frame or metrology frame. The coil holder may also be formed by the reference itself. Advantageously, the coil holder COH may, at least partially, be made of magnetically conductive material, e.g. a ferromagnetic material, such as CoFe, to form a back iron for the first coil CO-1 and the second coil CO-2. Such back iron increases the efficiency of the tubular linear actuator TA. The back iron may also be formed by another part of the tubular linear actuator TA mounted in a fixed relationship with the coil assembly CA. In an embodiment, the axial length of the back iron, i.e. the axial length of the magnetically conductive material, may be used to tune the axial stiffness of tubular linear actuator TA. For example, the axial stiffness may be made very low, e.g. almost zero if the backiron is extended significantly beyond the magnets of the magnet assembly MAG.

The first tubular coil CO-1 and the second tubular coil CO-2 may comprise conventional windings of wire having a circular cross section. When desired a cooling system may be provided to withdraw heat dissipated by the coil assembly CA. In the embodiment of FIG. 8, a tubular cooling systems COS is provided by an outer tubular cooling element that surrounds the tubular linear actuator TA to withdraw heat from the first tubular coil CO-1 and the second tubular coil CO-2. In addition, or as an alternative, cooling may be provided by further cooling elements, such as inner tubular cooling elements and/or annular cooling elements at the head ends of the coil assembly CA. The cooling elements may be provided concentrically with the coil assembly CA. The inner tubular cooling elements may be tubular elements at least partially surrounded by the coil assembly CA, while the outer tubular cooling elements may be tubular elements that at least partially surround the coil assembly CA and the coil holder COH, such as the tubular cooling element COS shown in FIG. 8. Alternatively, the outer tubular cooling elements may be tubular elements arranged between the coil holder COH and the coil assembly CA or in the coil holder COH.

Alternatively, edge windings may be applied in the first tubular coil CO-1 and the second tubular coil CO-2. The edge windings are for example made of copper wire having a rectangular cross section. The advantage of the edge windings is that the heat dissipated in the coil assembly CA can be better conducted, in particular in radial direction of the coil assembly CA, to the environment, for example by a tubular cooling system surrounding the coils. The cooling system may for instance be integrated in the coil holder COH.

The tubular linear actuator TA further comprises a tubular magnet assembly MAG comprising a series of permanent magnets with alternating polarization direction. The permanent magnets of the magnet assembly MAG may be ring shaped or tubular shaped. The permanent magnets may be assembled by magnet segments that are combined to create the ring or tubular shape.

The series of permanent magnets extends in the longitudinal direction of the tubular linear actuator TA and is arranged concentrically with respect to the longitudinal axis LA. The magnet assembly MAG extends at least partially in the coil assembly CA and is arranged movably in the direction of the longitudinally axis LA with respect to the coil assembly CA.

The polarization directions of the permanent magnets of the magnet assembly MAG alternate between an axial direction, i.e. parallel to the longitudinal axis LA, and a radial direction, i.e. perpendicular to the longitudinal axis LA of the tubular linear actuator TA. Such arrangement of polarization directions is also known as a Halbach arrangement of permanent magnets.

In the embodiment depicted in FIG. 8, the magnet assembly comprises a series of a first permanent magnet MAG-1, a second permanent magnet MAG-2 and a third permanent magnet MAG-3 that are each tubular or ring shaped and that are arranged concentrically with respect to the longitudinal axis LA of the tubular linear actuator TA. In an alternative embodiment, The first permanent magnet MAG-1 has a first polarization direction in a radial inward direction with respect to the longitudinal axis LA of the tubular linear actuator TA. The second permanent magnet MAG-2 has a second polarization direction parallel to the direction of the longitudinal axis LA of the tubular linear actuator TA. The third permanent magnet MAG-3 has a third polarization direction in a radial outward direction with respect to the longitudinal axis LA of the tubular linear actuator TA.

The first permanent magnet MAG-1, the second permanent magnet MAG-2 and the third permanent magnet MAG-3 are mounted on a magnet holder MGH. The magnet holder MGH is for example a tubular element as shown in FIG. 8 that may be mounted on a movable object to be displaced with the tubular linear actuator TA, for instance a shaft SH (shown in dashed lines in FIG. 8), or the magnet holder MGH may be formed by the movable object itself, for instance a shaft. Advantageously, the magnet holder MGH may, at least partially, be made of magnetically conductive material, e.g. a ferromagnetic material, such as CoFe, to increase the efficiency of the tubular linear actuator TA. The magnetically conductive material may also be arranged on another part of the tubular linear actuator TA mounted in a fixed relationship with the magnet assembly MAG.

The advantage of the one-phase tubular linear actuator TA of FIG. 8, is that the construction of this actuator provides a relatively high steepness, i.e. a relatively large actuation force with respect to the power dissipated by the coil assembly CA. It is desirable to have a relatively large steepness to keep the power dissipation below a maximum allowed power dissipation level. As a result, a same mover mass, i.e. the total mass moved by the tubular linear actuator TA, for example including shaft SH and objects connected to the shaft SH, can be displaced with a substantially smaller power dissipation, or the same power dissipation can be used to displace a substantially larger mover mass. This also provides a possibility to increase bandwidth of the tubular linear actuator TA.

The relative increase in steepness of the linear tubular actuator TA with respect to conventional linear voice coil motors may be at least 1.4, for example at least 1.8. The steepness of the embodiment shown in FIG. 8 may for example be about 28 $N^2/W$ (provided force/dissipated power) with a mover mass of about 0.2 kg, while a conventional linear voice coil actuator may have a steepness of about 13 $N^2/W$ with a mover mass of about 0.1 kg.

In the embodiment of FIG. 8, an axial length of the coil assembly CA, i.e. dimension parallel to the longitudinal axis LA, is substantially equal to an axial length of the magnet assembly MAG. By extending the axial length of the coil assembly CA to a length substantially larger than the axial length of the magnet assembly MAG the steepness may be increased.

In an alternative embodiment of the magnet assembly MAG of the embodiment of FIG. 8, one set of magnets of the magnet assembly MAG having a polarization in radial direction may be replaced by two magnets having a polarization direction in opposing axial directions, and the second permanent magnet MAG-2 having axial polarization direction may be omitted.

Correspondingly, to the embodiments of tubular linear actuators TA shown in FIGS. 5 and 7, the tubular linear actuator of FIG. 8 may be applied in a lithographic apparatus. The one-phase tubular linear actuator TA is in particular suitable to actuate short stroke displacements, where a relative high force is required in combination with a relatively low power dissipation and/or a small mover mass. The tubular linear actuators TA may for example be applied to displace optic elements, such as mirrors, of the projection optics of a lithographic apparatus.

Hereinabove the use of a tubular linear actuator TA for the positioning of a masking blade MB of a patterning device masking device PDMD has been described. The tubular coils CO of the tubular linear actuator TA make more efficient use of the coil volume, in particular in a relatively small volume. The edge windings of the phase legs PL1, PL2 of the coils CO provide for an improved conducting of the heat dissipated by the coil assembly CA to a cooling system.

Such tubular linear actuator TA may also be used as actuator in any other suitable actuator system to move a movable object to a desired position. The tubular linear actuator TA may in particular be useful for application in a lithographic apparatus in which there is a general desire to provide actuator systems having a small volume and a high heat conductivity in combination with a relatively high acceleration and velocity performance.

The present invention can also be characterized by the following clauses:

1. A tubular linear actuator, comprising:
   a tubular coil assembly comprising multiple tubular coils arranged next to each other in longitudinal direction of the tubular linear actuator and concentric with respect to a longitudinal axis of the tubular linear actuator, and
   a magnet assembly comprising a series of permanent magnets with alternating polarization direction extending in the longitudinal direction,
   wherein the magnet assembly is at least partially arranged in the coil assembly and movably with respect to the coil assembly, wherein the tubular coils comprise edge windings.

2. The tubular linear actuator of clause 1, wherein each coil comprises a first phase leg having a first winding in a first winding direction and a second phase leg comprising a second winding in a second winding direction, wherein the first winding and the second winding are serially connected such that a first current direction in the first winding is opposite to a second current direction in the second winding.

3. The tubular linear actuator of clause 2,
   wherein the first winding direction is opposite to the second winding direction and wherein a lead out of the first winding is connected to a lead in of the second winding, or
   wherein the first winding direction and the second winding direction are the same and wherein a lead out of the first winding is connected to a lead out of the second winding.

4. The tubular linear actuator of clause 2 or 3, wherein the first winding and/or the second winding comprises two or more concentric layers.

5. The tubular linear actuator of any of the preceding clauses, wherein the coil assembly comprises at one or each axial end an additional phase leg comprising a winding in the first winding direction or the second winding direction.

6. The tubular linear actuator of any of the preceding clauses, wherein the coil assembly is a three phase coil assembly.

7. The tubular linear actuator of clauses 5 and 6, wherein the coil assembly comprises one or more coil arrays, wherein each coil array comprises, arranged next to each other, a first coil connected to a first phase, a second coil connected to a second phase and a third coil connected to a third phase, wherein at the first axial end of the coil assembly, next to a respective first coil of a first coil array, an additional phase leg serially connected to the third coil of the first coil array is provided, and wherein at the second axial end of the coil assembly, next to a respective third coil of a second coil array, an additional phase leg serially connected to the first coil the second coil array is provided.

8. The tubular linear actuator of any of the preceding clauses, wherein polarization directions of the permanent magnets alternately extend in longitudinal direction and radial direction of the tubular linear actuator.

9. The tubular linear actuator of any of the preceding clauses, wherein the tubular linear actuator is configured for use in a lithographic apparatus, in particular as actuator for a masking blade of a patterning device masking device.

10. The tubular linear actuator of any of the preceding clauses, wherein the edge windings are made of copper wire having a rectangular cross section.

11. A tubular linear actuator, comprising:
a tubular coil assembly comprising multiple tubular coils arranged next to each other in longitudinal direction of the tubular linear actuator and concentric with respect to a longitudinal axis of the tubular linear actuator, and
a tubular magnet assembly comprising a series of permanent magnets with alternating polarization direction extending in the longitudinal direction,
wherein the magnet assembly is at least partially arranged in the coil assembly and is movable with respect to the coil assembly in an actuation direction parallel to the longitudinal axis,
wherein the tubular linear actuator is a one-phase tubular actuator.

12. The tubular linear actuator of clause 11, comprising:
wherein the tubular coil assembly comprises a first tubular coil and a second tubular coil, wherein the tubular linear actuator is arranged to provide a current flow in the first tubular coil in a first current direction and a current flow in the second tubular coil in a second current direction, wherein the first current direction and the second current direction are opposite to each other.

13. The tubular linear actuator of clause 11 or 12, wherein polarization directions of the permanent magnets alternately extend in longitudinal direction and radial direction of the tubular linear actuator.

14. The tubular linear actuator of any of the clauses 11-13, wherein the magnet assembly comprises:
a first permanent magnet having a first polarization direction in a radial inward direction with respect to the longitudinal axis of the tubular linear actuator,
a second permanent magnet having a second polarization direction parallel to the longitudinal axis of the tubular linear actuator, and
a third permanent magnet having a third polarization direction in a radial outward direction with respect to the longitudinal axis of the tubular linear actuator,
wherein the second permanent magnet is arranged between the first permanent magnet and the third permanent magnet.

15. The tubular linear actuator of any of the clauses 11-14, wherein the tubular linear actuator is configured for use in a lithographic apparatus.

16. The tubular linear actuator of any of the clauses 11-15, wherein the tubular coils comprise edge windings.

17. The tubular linear actuator of any of the clauses 11-16, wherein the permanent magnets are tubular or ring shaped.

18. A patterning device masking device arranged to delimit a beam dimension of a radiation beam of a lithographic apparatus, comprising one or more movable masking blades and at least one tubular linear actuator according to any of the preceding clauses to move the one or more masking blades.

19. The patterning device masking device of clause 18, wherein the patterning device masking device comprises multiple masking blades, and wherein at least masking blades arranged to move in the scanning direction are connected to a tubular linear actuator according to any of the preceding clauses.

20. The patterning device masking device of clause 18 or 19, wherein the magnet assembly is operatively connected to the respective masking blade.

21. A lithographic apparatus comprising:
a movable object, and
an actuator to move the movable object,
wherein the actuator is the tubular linear actuator of any of the clauses 1-17.

22. The lithographic apparatus of clause 21, wherein the lithographic apparatus comprises a patterning device masking device arranged to delimit a beam dimension of a radiation beam of a lithographic apparatus, the patterning device masking device comprising at least one movable masking blade, wherein the tubular linear actuator is connected to the at least one movable masking blade to move the at least one movable masking blade to a desired position.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A tubular linear actuator, comprising:
   a tubular coil assembly comprising multiple tubular coils arranged next to each other in a longitudinal direction of the tubular linear actuator and concentric with respect to a longitudinal axis of the tubular linear actuator; and
   a magnet assembly comprising a series of permanent magnets with alternating polarization direction extending in the longitudinal direction,
   wherein the magnet assembly is at least partially arranged in the tubular coil assembly and movably with respect to the tubular coil assembly,
   wherein the tubular coils comprise edge windings,
   wherein each tubular coil comprises a first phase leg having a first winding in a first winding direction and a second phase leg comprising a second winding in a second winding direction, wherein the first winding and the second winding are serially connected such that a first current direction in the first winding is opposite to a second current direction in the second winding, and
   wherein the tubular coil assembly comprises at one or each axial end an additional phase leg comprising a winding in the first winding direction or the second winding direction.

2. The tubular linear actuator of claim 1,
   wherein the first winding direction is opposite to the second winding direction and wherein a lead out of the first winding is connected to a lead in of the second winding, or
   wherein the first winding direction and the second winding direction are the same and wherein a lead out of the first winding is connected to a lead out of the second winding.

3. The tubular linear actuator of claim 1, wherein the first winding and/or the second winding comprises two or more concentric layers.

4. The tubular linear actuator of claim 1, wherein the tubular coil assembly is a three phase coil assembly.

5. The tubular linear actuator of claim 1, wherein the tubular coil assembly comprises one or more coil arrays, wherein each coil array comprises, arranged next to each other, a first coil connected to a first phase, a second coil connected to a second phase and a third coil connected to a third phase, wherein at the first axial end of the tubular coil assembly, next to a respective first coil of a first coil array, an additional phase leg serially connected to the third coil of the first coil array is provided, and wherein at the second axial end of the coil assembly, next to a respective third coil of a second coil array, an additional phase leg serially connected to the first coil of the second coil array is provided.

6. The tubular linear actuator of claim 1, wherein polarization directions of the permanent magnets alternately extend in a longitudinal direction and a radial direction of the tubular linear actuator.

7. The tubular linear actuator of claim 1, wherein the magnet assembly comprises:
   a first permanent magnet having a first polarization direction in a radial inward direction with respect to the longitudinal axis of the tubular linear actuator,
   a second permanent magnet having a second polarization direction parallel to the longitudinal axis of the tubular linear actuator, and
   a third permanent magnet having a third polarization direction in a radial outward direction with respect to the longitudinal axis of the tubular linear actuator,
   wherein the second permanent magnet is arranged between the first permanent magnet and the third permanent magnet.

8. The tubular linear actuator of claim 7, wherein the permanent magnets are tubular or ring shaped.

9. A patterning device masking device arranged to delimit a beam dimension of a radiation beam of a lithographic apparatus, comprising one or more movable masking blades and at least one tubular linear actuator as claimed in claim 1 to move the one or more masking blades.

10. The patterning device masking device of claim 9, wherein the magnet assembly is operatively connected to the respective masking blade.

11. A lithographic apparatus comprising:
    a movable object, and
    an actuator to move the movable object,
    wherein the actuator is the tubular linear actuator of claim 1.

12. The lithographic apparatus of claim 11, wherein the lithographic apparatus comprises a patterning device masking device arranged to delimit a beam dimension of a radiation beam of a lithographic apparatus, the patterning device masking device comprising at least one movable masking blade, wherein the tubular linear actuator is connected to the at least one movable masking blade to move the at least one movable masking blade to a desired position.

* * * * *